United States Patent [19]

Gotanda

[11] Patent Number: 4,879,528
[45] Date of Patent: Nov. 7, 1989

[54] ULTRASONIC OSCILLATION CIRCUIT

[75] Inventor: Masakazu Gotanda, Sagamihara, Japan

[73] Assignee: Olympus Optical Co., Ltd., Tokyo, Japan

[21] Appl. No.: 238,186

[22] Filed: Aug. 30, 1988

[51] Int. Cl.$^4$ .......................... H03L 7/10; H03L 7/12; G05D 19/02

[52] U.S. Cl. .......................................... 331/4; 331/15; 331/25; 331/65; 331/158; 310/316

[58] Field of Search .................... 331/1 R, 4, 8, 14, 15, 331/17, 65, 25, 154, 158; 310/314, 316, 317, 318, 319

[56] References Cited

U.S. PATENT DOCUMENTS 4,703,213 10/1987 Gasler ................................ 310/316

FOREIGN PATENT DOCUMENTS

WO87/01276 3/1987 PCT Int'l Appl. .

Primary Examiner—David Mis

Attorney, Agent, or Firm—Stevens, Davis, Miller & Mosher

[57] ABSTRACT

A circuit for generating a driving signal for an ultrasonic vibrating element including a voltage controlled oscillator for generating an oscillation signal which is supplied to the ultrasonic vibrating element as the driving signal, a phase difference detector for detecting a phase difference between the voltage and the current of the driving signal to produce a control voltage corresponding to the detected phase difference, said control voltage being applied to a control input of the voltage controlled oscillator, a comparator for comparing the control voltage from the phase difference detector with a reference voltage to generate an output signal when the control voltage exceeds the reference voltage, and a voltage setter for responding to the output signal to reset the oscillation frequency of the voltage controlled oscillator to a predetermined frequency which is lower than the optimum resonance frequency so that the ultrasonic vibrating element is energized in the most efficient manner.

18 Claims, 6 Drawing Sheets

FIG_1

FIG-2

FIG_3

FIG_8

FIG_9

ULTRASONIC OSCILLATION CIRCUIT

BACKGROUND OF THE INVENTION

The present invention relates to an ultrasonic oscillation circuit for generating a driving signal for an ultrasonic vibrating element.

Figure 1:
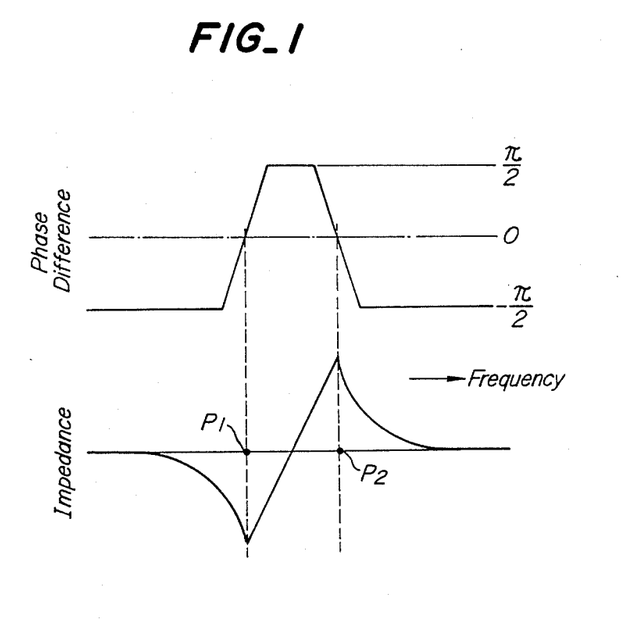
FIG. 1 is a graph showing the characteristics of the impedance and phase difference of the ultrasonic vibrating element.

FIG. 1 shows general characteristics of an ultrasonic vibrating element near a resonance frequency, i.e. characteristics of an impedance and a phase difference between the voltage applied across the element and the current flowing through the element. The phase difference becomes zero at two frequency points $P_1$ and $P_2$ and the impedance becomes minimum at the lower frequency point $P_1$, but becomes maximum at the higher frequency point $P_2$. It is matter of cause that in order to transmit the electric power to the ultrasonic vibrating element in an efficient manner, it is advantageous to vibrate the element at the lower frequency point $P_1$. Therefore, the lower frequency point is also called the optimum frequency point.

In order to drive the ultrasonic vibrating element at the above mentioned optimum frequency point $P_1$, there have been proposed various ultrasonic oscillation circuits in, for instance, Japanese Patent Publications Kokai Sho 48-79,613, Sho 52-27,625, Sho 56-7,669 and Sho 59-87,078, Japanese Utility Model Publication Kokai Sho 59-180,774, and PCT International Publication W087/01276. In these known ultrasonic oscillation circuits, the phase difference between the voltage applied across the ultrasonic vibrating element and the current flowing through the element is detected and the oscillation frequency is controlled in accordance with the phase difference such that the phase difference falls within a predetermined narrow range.

However, in the known ultrasonic oscillation circuits, since the oscillation frequency is controlled in accordance only with the phase difference between the voltage and the current of the driving signal, even if the phase difference becomes equal to a given value e.g. zero, the element might vibrate at the higher frequency point $P_2$ at which the impedance becomes maximum.

Further, the actual resonance frequency of the ultrasonic vibrating element is influenced not only by the resonance frequency of the element itself, but also by a mechanical resonance point of an ultrasonic wave propagating medium which is brought into contact with the element, so that there are plural frequency points at which the phase difference has the same value. This results in that the resonance frequency of the ultrasonic vibrating element is not well controlled within a desired frequency range only by the phase difference.

In the ultrasonic oscillation circuit disclosed in the above mentioned PCT International Publication W087/01276, there is provided a phase control loop in which a phase difference between an output signal from a voltage controlled oscillator and a driving signal for the ultrasonic vibrating element is detected and a control voltage corresponding to the detected phase difference is applied to the voltage controlled oscillator by means of a limiter. In such a circuit, when the impedance of the ultrasonic vibrating element is changed to a large extent, the control voltage having an amplitude equal to a threshold voltage of the limiter is continuously applied to the voltage controlled oscillator, and thus the oscillation frequency of the voltage controlled oscillator could not be returned into the optimum frequency point $P_1$ promptly.

SUMMARY OF THE INVENTION

The present invention has for its object to provide a novel and useful ultrasonic oscillation circuit, in which the above mentioned problem of the known circuits can be effectively solved and the ultrasonic vibrating element can be always driven at such a frequency within a desired frequency range that both the phase difference and impedance become minimum, and therefore the electric power can be supplied to the ultrasonic vibrating element efficiently.

According to the invention, an ultrasonic oscillation circuit for generating a driving signal for driving an ultrasonic vibrating element comprises:

oscillating means having a control input for generating an oscillation signal having a frequency in accordance with a control signal supplied to said control input;

driving means for supplying said oscillation signal from the oscillating means to the ultrasonic vibrating element as a driving signal;

phase difference detecting means for detecting a phase difference between a voltage and a current of the driving signal supplied to the ultrasonic vibrating element;

means for supplying the control signal corresponding to said phase difference to said control input of said oscillating means;

comparing means for comparing said phase difference with a reference value to generate an output signal each time the phase difference exceeds the reference value; and resetting means for responding to said output signal from the comparing means and supplying a control signal to said control terminal of said oscillating means, said control signal having such a value that the frequency of the oscillation signal from the oscillating means is reset to a predetermined frequency.

In a preferred embodiment of the ultrasonic oscillation circuit according to the invention, said predetermined frequency is set to a lower frequency than the optimum frequency point $P_1$. When the oscillation frequency becomes higher than the optimum frequency point $P_1$ by a predetermined amount corresponding to the reference value, the oscillation frequency is forcedly reset to the frequency lower than the optimum frequency point $P_1$, and then the oscillation frequency is increased up to the optimum frequency point in a rapid manner.

DESCRIPTION OF THE PREFERRED EMBODIMENTS

Figure 2:
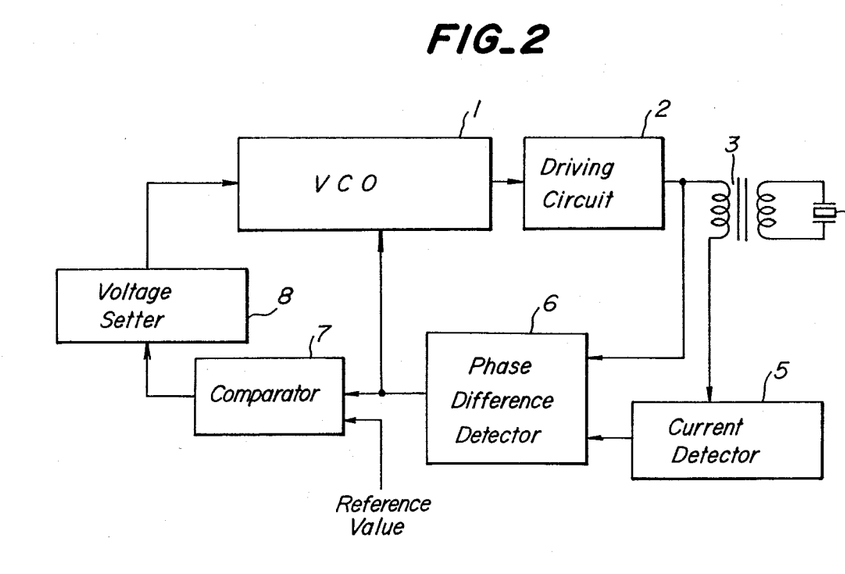
FIG. 2 is a block diagram illustrating the principal construction of the ultrasonic oscillation circuit according to the invention.

FIG. 2 is a block diagram showing the principal construction of the ultrasonic oscillation circuit according to the invention. The ultrasonic oscillation circuit comprises a voltage controlled oscillator (VCO) 1, a driving circuit 2 for converting an oscillation signal generated from the VCO 1 into a driving signal, and a matching transformer 3 for supplying the driving signal to an ultrasonic vibrating element 4. The driving current flowing through the ultrasonic vibrating element 4 is detected by a current detector 5. A phase difference between the detected current and the driving voltage applied across the ultrasonic vibrating element 4 is detected by a phase difference detector 6 which generates a control voltage corresponding to the detected phase difference. The control voltage thus generated is applied to a control input of the VCO 1 to control the frequency of the oscillation signal. At the same time, the phase difference detected by the phase difference detector 6 is compared, in a comparator 7, with a predetermined reference value. When the phase difference exceeds the reference value, the comparator 7 sends a signal to a voltage setter 8 which then applies a control voltage having a predetermined amplitude to the VCO 1. Therefore, the oscillation frequency of the VCO 1 is reset to a predetermined frequency corresponding to the control voltage from the voltage setter 8. Then, the VCO 1 sweeps the frequency in accordance with the phase difference up to the optimum oscillation frequency. According to the invention, the oscillation frequency of the VCO 1 corresponding to the control voltage having the predetermined amplitude may be set to a frequency lower than the optimum frequency at which the impedance of the ultrasonic vibrating element becomes minimum. In the ultrasonic oscillation circuit shown in FIG. 2, the current and voltage of the driving signal are derived from a primary side of the matching transformer 3. This is due to the fact that in the resonance condition the ultrasonic vibrating element 4 may constitute a capacitive load, so that the voltage and current at the primary side of the matching transformer 3 have the same phases as those of the voltage and current of the driving signal at a secondary side of the matching transformer. It should be noted that the phase difference between the voltage and current of the driving signal may be equally derived from the secondary side of the matching transformer.

Figure 3:
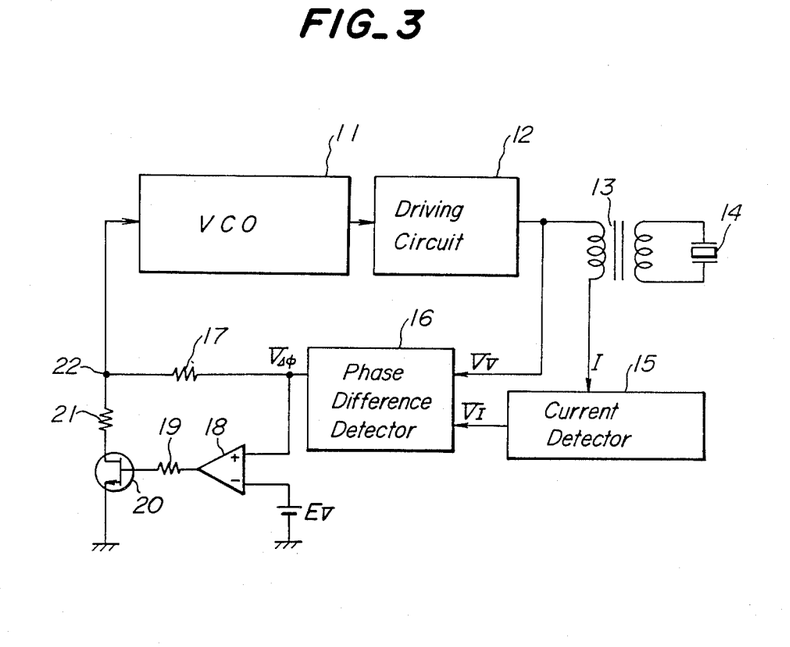
FIG. 3 is a block diagram depicting a first embodiment of the ultrasonic oscillation circuit according to the invention.

FIG. 3 is a block diagram showing the construction of a first embodiment of the ultrasonic oscillation circuit according to the invention. In the present embodiment, an output signal generated from a voltage controlled oscillator 11 is amplified by a driving circuit 12 and then is supplied to an ultrasonic vibrating element 14 via a matching transformer 13. A driving current I for the ultrasonic vibrating element 14 is converted into a voltage by means of a current detector 15, and a phase difference $\Delta\Phi$ between a phase of the voltage supplied from the current detector 15 and a phase of a driving voltage $V_v$ applied to the ultrasonic vibrating element 14 is detected by a phase difference detector 16 which produces a voltage $V_{\Delta\Phi}$ corresponding to the detected phase difference $\Delta\Phi$. The output voltage $V_{\Delta\Phi}$ from the phase difference detector 16 is applied via a resistor 17 to the VCO 11. At the same time, the output voltage $V_{\Delta\Phi}$ is applied to a non-inverted input of a comparator 18 to whose inverted input is applied a reference voltage $E_v$. An output from the comparator 18 is applied to a gate of a field effect transistor (FET) 20 by means of a resistor 19. A drain of the FET 20 is connected via a resistor 21 to a connection point 22 between the control input of the VCO 11 and one end of the resistor 17. A source of the FET 20 is connected to the ground potential point.

Figure 4:
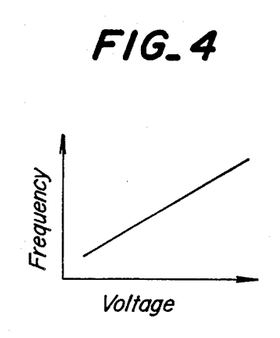
FIG. 4 is a graph representing a characteristic of a voltage controlled oscillator shown in FIG. 3.
Figure 5:
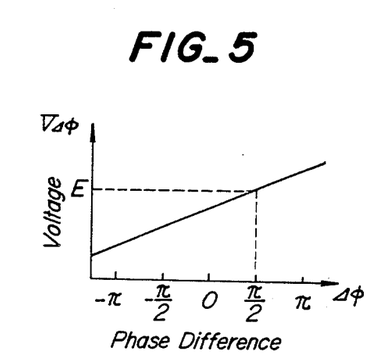
FIG. 5 is a graph illustrates a characteristic of a phase difference detector shown in FIG. 3.

FIG. 4 is a graph representing an input-output characteristic of the VCO 11. The oscillation frequency of the VCO 11 becomes higher in accordance with an increase of the control voltage applied to its control input. FIG. 5 shows an input-output characteristic of the phase difference detector 16. In FIG. 5, the horizontal axis denotes a phase difference $\Delta\Phi$ of the current with respect to the voltage. In the present embodiment, the reference voltage $E_v$ is set to a value which is slightly lower than a voltage E which is produced from the phase difference detector 16 when the phase difference $\Delta\Phi$ is equal to $\pi/2$.

Figure 6:
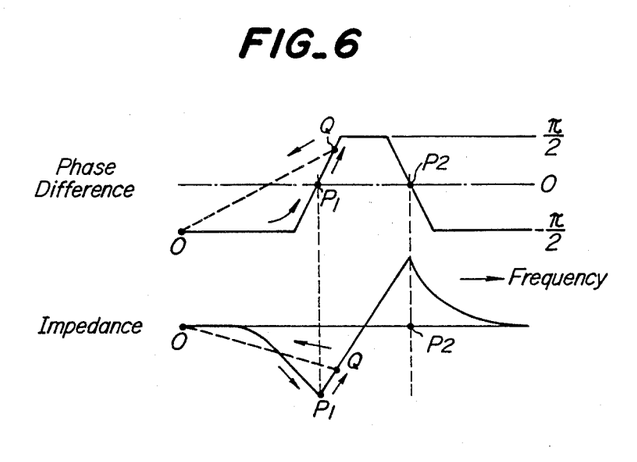
FIG. 6 is a graph representing a relation between the frequency and the phase difference and impedance for explaining the operation of the ultrasonic oscillation circuit according to the invention.

Now the operation of the ultrasonic oscillation circuit of the present embodiment will be explained also with reference to a graph shown in FIG. 6, which represents characteristics of the phase difference of the driving signal and the impedance of the ultrasonic vibrating element 14.

The voltage controlled oscillator 11, driving circuit 12, current detector 15 and phase difference detector 16 constitute a phase locked loop (PLL) which operates in such a manner that the phase difference $\Delta\Phi$ between the voltage $V_v$ and the current I of the driving signal becomes zero. When the phase difference becomes just zero, the ultrasonic oscillation circuit operates at the lower optimum frequency point $P_1$. In this condition, the impedance becomes minimum and the electric power can be supplied to the ultrasonic vibrating element most efficiently. As long as the system operates stably, the ultrasonic vibrating element 14 will continue to vibrate at the optimum frequency point $P_1$. Under this stable condition, the output from the comparator 18 is in the low level so that the FET 20 remains in the cut-off condition. Therefore, the load applied to the ultrasonic vibrating element 14 fluctuates slightly and the oscillation frequency tends to change slightly, the oscillation frequency is automatically controlled into the optimum frequency point $P_1$ due to the feedback action of the PLL circuit.

When the load varies abruptly to a large extent and the operation point exceeds a frequency point Q and the output voltage $V_{\Delta\Phi}$ of the phase difference detector 16 exceeds the reference voltage $E_v$, the output from the comparator 18 is changed to the high level and the FET 20 becomes conductive. Therefore, a reset voltage determined by the ratio of resistance values of the resistors 17 and 21 is applied to the voltage controlled oscillator 11. This reset voltage has been set to a value lower than the output voltage E generated from the phase difference detector 16 when the phase difference is equal to π/2. Then the oscillation frequency of the voltage controlled oscillator 11 is reset to a point 0 corresponding to the reset voltage. The frequency at the point 0 is lower than the optimum frequency at the point $P_1$. Then the PLL circuit operates such that the oscillation frequency is increased toward the optimum frequency point $P_1$.

As explained above, in the ultrasonic oscillation circuit according to the invention, the ultrasonic vibrating element is driven at the frequency at which the phase difference between the voltage and the current of the driving signal and the impedance become minimum within the frequency range from the point 0 to the point Q and is never driven at the frequency point $P_2$. In this manner, the electric power can be supplied to the ultrasonic vibrating element very efficiently.

Figure 7:
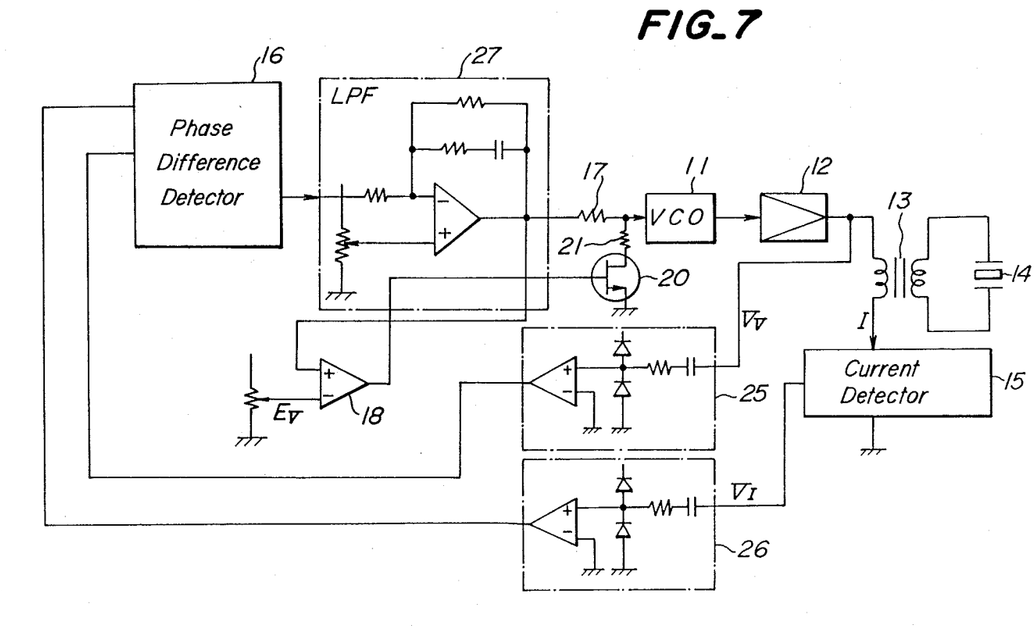
FIG. 7 is a block diagram showing a second embodiment of the ultrasonic oscillation circuit according to the invention.

FIG. 7 is a block diagram illustrating a second embodiment of the ultrasonic oscillation circuit according to the invention. In the present embodiment, the voltage $V_v$ applied across the ultrasonic vibrating element 14 and a voltage $V_I$ having a phase corresponding to that of the driving current I are converted into bivalent signals by means of bivalent circuits 25 and 26, respectively. These bivalent signals are supplied to the phase difference detector 16 to produce an output signal having an amplitude corresponding to the phase difference. The output voltage is applied via a low pass filter (LPF) 27 to the voltage controlled oscillator 11 as well as to the non-inverted input of the comparator 18. The remaining construction of the present embodiment is entirely same as that of the previous embodiment.

In the present embodiment, since the analog voltage applied across the ultrasonic vibrating element 14 and the analog output voltage from the current detector 15 are converted into the bivalent signals by means of the bivalent circuits 25 and 26, respectively, the signals can be processed easily.

Figure 8:
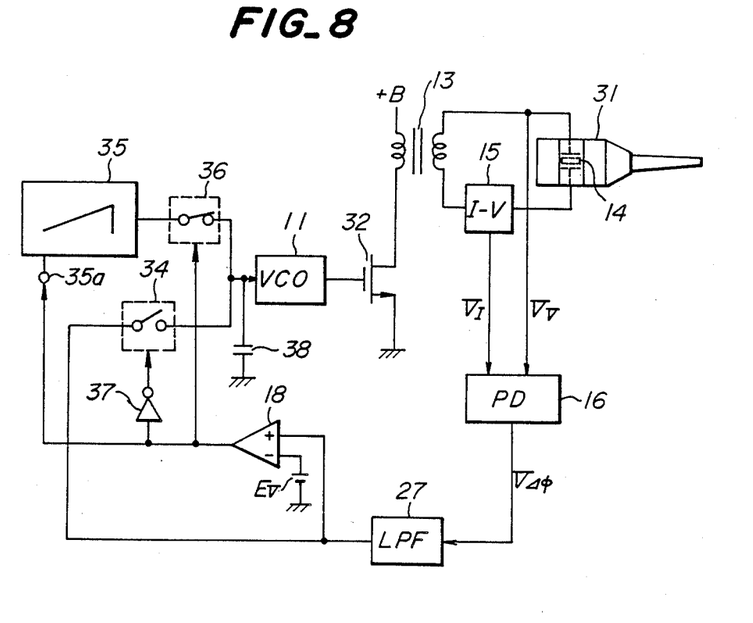
FIG. 8 is a block diagram illustrating a third embodiment of the ultrasonic oscillation circuit according to the invention.

FIG. 8 is a block diagram showing a third embodiment of the ultrasonic vibration circuit according to the invention. Also in the present embodiment, portions similar to those shown in the previous embodiments are denoted by the same reference numerals used in the previous embodiments. In the instant embodiment, the ultrasonic vibrating element 14 is provided in an ultrasonic machine 31 of Langevin vibrator type and is energized by the output signal from the voltage controlled oscillator 11 via FET 32 and matching transformer 13. In order to detect the phase difference between the voltage and the current of the driving signal for the ultrasonic vibrating element 14, the current detector 15 is connected to the secondary side of the matching transformer 13 to derive the voltage whose phase corresponds to that of the driving current. The phase difference between the output voltage $V_I$ from the current detector 15 and the voltage $V_v$ applied to the ultrasonic vibrating element 14 is detected by the phase difference detector 16 to derive the voltage $V_{\Delta\phi}$ corresponding to the phase difference between the voltage and the current of the driving signal. This voltage $V_{\Delta\phi}$ is applied to the non-inverted input of the comparator 18 via the low pass filter 27, to the inverted input of which is applied the reference voltage $E_v$. The output voltage $V_{\Delta\phi}$ of the low pass filter 27 is applied to the control input of the voltage controlled oscillator 11 by means of a first switch 34. The output signal from the comparator 18 is applied to a trigger input 35a of a ramp generator 35. The output signal of the comparator 18 is also applied, as a control signal, to a second switch 36 which is connected in a line which connects the output of the ramp generator 35 to the control input of the voltage controlled oscillator 11 as well as to the first switch 34 via an inverter 37. The control input of the voltage controlled oscillator 11 is coupled with the ground potential by means of a capacitor 38, so that the voltage controlled oscillator is not affected by switching bounds which might be produced when the first and second switches 34 and 36 are changed over.

When the secondary circuit of the matching transformer 13 deviates from the resonance frequency to a large extent, the phase difference between the voltage and the current of the driving signal for the ultrasonic vibrating element 14, and the voltage $V_{\Delta\phi}$ exceeds the reference voltage $E_v$, so that the output signal from the comparator 18 changes into the high level. Therefore, the first switch 34 is opened and the second switch 36 is closed. At the same time, the ramp generator 35 is triggered to initiate the generation of the ramp voltage. This ramp voltage is applied via the second switch 36 to the VCO 11 and the oscillation frequency of the VCO sweeps from the low frequency point 0 toward the optimum frequency point P. In this manner, the oscillation frequency of the VCO 11 increases gradually and becomes near the resonance frequency point P of the ultrasonic vibrating element 14. When the output voltage from the low pass filter 33 enters within the set voltage range of the comparator 18, the first switch 34 is closed and the second switch 36 is opened, so that the circuit operates as the normal PLL circuit. In the present embodiment, there is arranged the ramp generator 35 and the voltage controlled oscillator 11 effects the frequency sweep. Therefore, the desired resonance condition can be restored rapidly.

Figure 9:
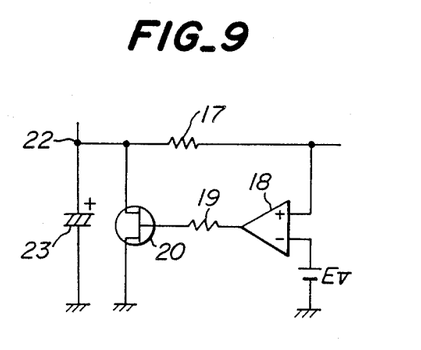
FIG. 9 is a circuit diagram showing a part of a fourth embodiment of the ultrasonic oscillation circuit according to the invention.

FIG. 9 is a circuit diagram showing a part of a modification of the first embodiment illustrated in FIG. 3. In the present embodiment, a capacitor 23 is connected in parallel with the FET 20. In this embodiment, the voltage controlled oscillator 11 can be effectively protected against switching bound which might be generated when the FET 20 is changed into the conductive condition.

As explained above in detail, in the ultrasonic oscillation circuit according to the invention, the oscillation frequency of the voltage controlled oscillator is controlled in accordance with the phase difference between the voltage and the current of the driving signal for the ultrasonic vibrating element in such a manner that when the phase difference exceeds the predetermined reference value, the oscillation frequency is reset to the predetermined frequency which is lower than the optimum resonance frequency and then is swept toward the resonance frequency in accordance with the detected phase difference. Therefore, the ultrasonic vibrating element can be always driven at the frequency at which the phase difference and the impedance become minimum within the given frequency range, and thus the electric power can be supplied to the ultrasonic vibrating element very efficiently.

What is claimed is:

1. An ultrasonic oscillation circuit for generating a driving signal for driving an ultrasonic vibrating element comprising:
    oscillating means having a control input for generating an oscillation signal having a frequency in accordance with a control signal supplied to said control input;

driving means for supplying said oscillation signal from the oscillating means to the ultrasonic vibrating element as a driving signal;

phase difference detecting means for detecting a phase difference between a voltage and a current of the driving signal supplied to the ultrasonic vibrating element;

means for supplying the control signal corresponding to said phase difference to said control input of said oscillating means;

comparing means for comparing said phase difference with a reference value to generate an output signal each time the phase difference exceeds the reference value; and resetting means for responding to said output signal from the comparing means and supplying a control signal to said control input of said oscillating means, said resetting means comprising a semiconductor switch connected to said control input of said oscillating means, said output signal from said comparing means being supplied to a control input of said semiconductor switch to change said control signal to a level such that the frequency of the oscillation signal from the oscillating means is reset to a predetermined frequency.

2. An ultrasonic oscillation circuit according to claim 1, wherein said predetermined frequency is set to a frequency lower than a desired resonance frequency.

3. An ultrasonic oscillation circuit according to claim 2, wherein said oscillating means comprises a voltage controlled oscillator.

4. An ultrasonic oscillation circuit according to claim 3, wherein said driving means comprises an amplifier for amplifying an oscillation signal supplied from said voltage controlled oscillator and a matching transformer having a primary side connected to an output of said amplifier and a secondary side connected to said ultrasonic vibrating element.

5. An ultrasonic oscillation circuit according to claim 4, wherein said phase difference detecting means detects the phase difference between the voltage and the current of the driving signal which is derived from the primary side of said matching transformer.

6. An ultrasonic oscillation circuit according to claim 4, wherein said phase difference detecting means detects the phase difference between the voltage and the current of the driving signal which is derived from the secondary side of said matching transformer.

7. An ultrasonic oscillation circuit for generating a driving signal for driving an ultrasonic vibrating element comprising:

oscillating means having a control input for generating an oscillation signal having a frequency in accordance with a control signal supplied to said control input;

driving means for supplying said oscillation signal from the oscillating means to the ultrasonic vibrating element as a driving signal;

phase difference detecting means for detecting a phase difference between a voltage and a current of the driving signal supplied to the ultrasonic vibrating element;

means for supplying the control signal corresponding to said phase difference to said control input of said oscillating means;

comparing means for comparing said phase difference with a reference value to generate an output signal each time the phase difference exceeds the reference value; and resetting means for responding to said output signal from the comparing means and supplying a control signal to said control terminal of said oscillating means, said control signal having such a value that the frequency of the oscillation signal from the oscillating means is reset to a predetermined frequency, wherein said predetermined frequency is set to a frequency lower than a desired resonance frequency, wherein said oscillating means comprises a voltage controlled oscillator, wherein said driving means comprises an amplifier for amplifying an oscillation signal supplied from said voltage controlled oscillator and a matching transformer having a primary side connected to an output of said amplifier and a secondary side connected to said ultrasonic vibrating element, wherein said phase difference detecting means detects the phase difference between the voltage and the current of the driving signal which is derived from the primary side of said matching transformer, and wherein said reference value in the comparing means is set to a value corresponding to a phase difference which is slightly smaller than $\pi/2$.

8. An ultrasonic oscillation circuit according to claim 7, wherein, said comparing means comprises a comparator having a non-inverted input for receiving the output signal from the phase difference detecting means and an inverted input for receiving a voltage corresponding to said reference value, and said resetting means comprises a transistor which is on-off controlled by the output signal from the comparator and having a main current path, a first resistor connected in series with said main current path of the transistor, and a second resistor connected between an output of said phase difference detecting means and the control input of the voltage controlled oscillator.

9. An ultrasonic oscillation circuit according to claim 8, wherein said transistor is formed by a field effect transistor.

10. An ultrasonic oscillation circuit according to claim 8, further comprising a low pass filter connected between the output of the phase difference detecting means and the second resistor.

11. An ultrasonic oscillation circuit according to claim 9, further comprising a capacitor connected in parallel with a source-drain path of the field effect transistor.

12. An ultrasonic oscillation circuit for generating a driving signal for driving an ultrasonic vibrating element comprising:

oscillating means having a control input for generating an oscillation signal having a frequency in accordance with a control signal supplied to said control input;

driving means for supplying said oscillation signal from the oscillating means to the ultrasonic vibrating element as a driving signal;

phase difference detecting means for detecting a phase difference between a voltage and a current of the driving signal supplied to the ultrasonic vibrating element;

means for supplying the control signal corresponding to said phase difference to said control input of said oscillating means;

comparing means for comparing said phase difference with a reference value to generate an output signal each time the phase difference exceeds the reference value; and resetting means for responding to said output signal from the comparing means and supplying a control signal to said control terminal of said oscillating means, said control signal having such a value that the frequency of the oscillation signal from the oscillating means is reset to a predetermined frequency, wherein said predetermined frequency is set to a frequency lower than a desired resonance frequency, wherein said oscillating means comprises a voltage controlled oscillator, wherein said driving means comprises an amplifier for amplifying an oscillation signal supplied from said voltage controlled oscillator and a matching transformer having a primary side connected to an output of said amplifier and a secondary side connected to said ultrasonic vibrating element, wherein said phase difference detecting means detects the phase difference between the voltage and the current of the driving signal which is derived from the primary side of said matching transformer, and wherein said resetting means comprises a first switch connected between the output of the phase difference detecting means and the control input of the voltage controlled oscillator, a ramp generator having a trigger input connected to the output of the comparing means and an output, a second switch connected between the output of the ramp generator and the control input of the voltage controlled oscillator, an inverter for supplying an inverted signal of the output signal from said comparing means to said first switch as a control signal, and a line for supplying the output signal from the comparing means to said second switch as a control signal.

13. An ultrasonic oscillation circuit for generating a driving signal for driving an ultrasonic vibrating element comprising:

oscillating means having a control input for generating an oscillation signal having a frequency in accordance with a control signal supplied to said control input;

driving means for supplying said oscillation signal from the oscillating means to the ultrasonic vibrating element as a driving signal;

phase difference detecting means for detecting a phase difference between a voltage and a current of the driving signal supplied to the ultrasonic vibrating element;

means for supplying the control signal corresponding to said phase difference to said control input of said oscillating means;

comparing means for comparing said phase difference with a reference value to generate an output signal each time the phase difference exceeds the reference value; and resetting means for responding to said output signal from the comparing means and supplying a control signal to said control terminal of said oscillating means, said control signal having such a value that the frequency of the oscillation signal from the oscillating means is reset to a predetermined frequency, wherein said predetermined frequency is set to a frequency lower than a desired resonance frequency, wherein said oscillating means comprises a voltage controlled oscillator, wherein said driving means comprises an amplifier for amplifying an oscillation signal supplied from said voltage controlled oscillator and a matching transformer having a primary side connected to an output of said amplifier and a secondary side connected to said ultrasonic vibrating element, wherein said phase difference detecting means detects the phase difference between the voltage and the current of the driving signal which is derived from the secondary side of said matching transformer, and wherein said reference value in the comparing means is set to a value corresponding to a phase difference which is slightly smaller than $\pi/2$.

14. An ultrasonic oscillation circuit according to claim 13, wherein, said comparing means comprises a comparator having a non-inverted input for receiving the output signal from the phase difference detecting means and an inverted input for receiving a voltage corresponding to said reference value, and said resetting means comprises a transistor which is on-off controlled by the output signal from the comparator and having a main current path, a first resistor connected in series with said main current path of the transistor, and a second resistor connected between an output of said phase difference detecting means and the control input of the voltage controlled oscillator.

15. An ultrasonic oscillation circuit according to claim 14, wherein said transistor is formed by a field effect transistor.

16. An ultrasonic oscillation circuit according to claim 14, further comprising a low pass filter connected between the output of the phase difference detecting means and the second resistor.

17. An ultrasonic oscillation circuit according to claim 15, further comprising a capacitor connected in parallel with a source-drain path of the field effect transistor.

18. An ultrasonic oscillation circuit for generating a driving signal for driving an ultrasonic vibrating element comprising:

oscillating means having a control input for generating an oscillation signal having a frequency in accordance with a control signal supplied to said control input;

driving means for supplying said oscillation signal from the oscillating means to the ultrasonic vibrating element as a driving signal;

phase difference detecting means for detecting a phase difference between a voltage and a current of the driving signal supplied to the ultrasonic vibrating element;

means for supplying the control signal corresponding to said phase difference to said control input of said oscillating means;

comparing means for comparing said phase difference with a reference value to generate an output signal each time the phase difference exceeds the reference value; and resetting means for responding to said output signal from the comparing means and supplying a control signal to said control terminal of said oscillating means, said control signal having such a value that the frequency of the oscillation signal from the oscillating means is reset to a predetermined frequency, wherein said predetermined frequency is set to a frequency lower than a desired resonance frequency, wherein said oscillating means comprises a voltage controlled oscillator, wherein said driving means comprises an amplifier for amplifying an oscillation signal supplied from said voltage controlled oscillator and a matching transformer having a primary side connected to an output of said amplifier and a secondary side connected to said ultrasonic vibrating element, wherein said phase difference detecting means detects the phase difference between the voltage and the current of the driving signal which is derived from the secondary side of said matching transformer, and wherein said resetting means comprises a first switch connected between the output of the phase difference detecting means and the control input of the voltage controlled oscillator, a ramp generator having a trigger input connected to the output of the comparing means and an output, a second switch connected between the output of the ramp generator and the control input of the voltage controlled oscillator, an inverter for supplying an inverted signal of the output signal from said comparing means to said first switch as a control signal, and a line for supplying the output signal from the comparing means to said second switch as a control signal.

* * * * *